United States Patent
Chen et al.

(10) Patent No.: US 10,276,549 B2
(45) Date of Patent: *Apr. 30, 2019

(54) PACKAGE STRUCTURE WITH DUMMY DIE

(71) Applicant: TAIWAN SEMICONDUCTOR MANUFACTURING CO., LTD., Hsinchu (TW)

(72) Inventors: Hsien-Wei Chen, Hsinchu (TW); Li-Hsien Huang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,109

(22) Filed: Feb. 9, 2018

(65) Prior Publication Data
US 2018/0166427 A1    Jun. 14, 2018

Related U.S. Application Data

(63) Continuation of application No. 15/268,843, filed on Sep. 19, 2016, now Pat. No. 9,922,964.

(51) Int. Cl.
*H01L 23/00* (2006.01)
*H01L 25/00* (2006.01)
(Continued)

(52) U.S. Cl.
CPC ...... *H01L 25/105* (2013.01); *H01L 23/49838* (2013.01); *H01L 23/5389* (2013.01); *H01L 24/09* (2013.01); *H01L 24/19* (2013.01); *H01L 24/20* (2013.01); *H01L 25/0652* (2013.01); *H01L 25/50* (2013.01); *H01L 23/49816* (2013.01); *H01L 23/49827* (2013.01); *H01L 25/0657* (2013.01); *H01L 2224/0401* (2013.01); *H01L 2224/04042* (2013.01); *H01L 2224/04105* (2013.01); *H01L 2224/12105* (2013.01); *H01L 2224/32145* (2013.01);
(Continued)

(58) Field of Classification Search
CPC ....... H01L 23/52; H01L 23/498; H01L 23/31; H01L 25/10; H01L 25/065; H01L 23/00; H01L 25/00; H01L 25/105; H01L 23/49816; H01L 23/49827; H01L 23/49838; H01L 24/09; H01L 25/0652; H01L 25/0657; H01L 25/50; H01L 2224/0401; H01L 2224/04042; H01L 2224/48091; H01L 2225/06548; H01L 2225/06568; H01L 2225/107
USPC ......................................... 257/737, 738, 778
See application file for complete search history.

(56) References Cited

U.S. PATENT DOCUMENTS 8,361,842 B2    1/2013  Yu et al.
8,680,647 B2    3/2014  Yu et al.
(Continued)

*Primary Examiner* — Alexander O Williams
(74) *Attorney, Agent, or Firm* — Birch, Stewart, Kolasch & Birch, LLP

(57) ABSTRACT

A package structure and method for forming the same are provided. The package structure includes a package component, and a device die formed over the package component. The device die includes a device substrate and a conductive pad over the device substrate, and the device die has a first height. The package structure also includes a dummy die formed over the package component and adjacent to the device die, and the dummy die has a second height smaller than the first height.

20 Claims, 17 Drawing Sheets

(51) Int. Cl.
*H01L 25/10* (2006.01)
*H01L 23/498* (2006.01)
*H01L 23/538* (2006.01)
*H01L 25/065* (2006.01)

(52) U.S. Cl.
CPC ............... *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06548* (2013.01); *H01L 2225/06568* (2013.01); *H01L 2225/107* (2013.01); *H01L 2225/1035* (2013.01); *H01L 2225/1041* (2013.01); *H01L 2225/1058* (2013.01); *H01L 2924/1305* (2013.01); *H01L 2924/13091* (2013.01); *H01L 2924/1436* (2013.01); *H01L 2924/1437* (2013.01); *H01L 2924/15311* (2013.01); *H01L 2924/3511* (2013.01); *H01L 2924/3512* (2013.01); *H01L 2924/37001* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,281,346 B1* | 3/2016 | Lim | H01L 27/3223 |
| 9,437,583 B1 | 9/2016 | Shih et al. | |
| 9,922,964 B1* | 3/2018 | Chen | H01L 23/49816 |
| 2007/0066102 A1 | 3/2007 | Takemoto et al. | |
| 2009/0224400 A1* | 9/2009 | Rahman | H01L 25/0652 257/713 |
| 2010/0224927 A1* | 9/2010 | Ishihara | H01L 27/11521 257/324 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0292831 A1 | 11/2013 | Liu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0093858 A1 | 4/2015 | Hwang et al. | |
| 2015/0262972 A1 | 9/2015 | Katkar et al. | |
| 2015/0311182 A1 | 10/2015 | Lee et al. | |
| 2015/0371936 A1 | 12/2015 | Chen et al. | |
| 2016/0093572 A1 | 3/2016 | Chen | |
| 2016/0118333 A1 | 4/2016 | Lin | |
| 2016/0230391 A1 | 8/2016 | Fox | |
| 2016/0358865 A1 | 12/2016 | Shih et al. | |
| 2017/0033062 A1 | 2/2017 | Liu et al. | |
| 2017/0033090 A1 | 2/2017 | Hsieh et al. | |
| 2017/0284951 A1 | 10/2017 | Pindl et al. | |
| 2018/0122789 A1* | 5/2018 | Kang | H01L 24/20 |
| 2018/0151495 A1* | 5/2018 | Hsu | H01L 23/5283 |

* cited by examiner

PACKAGE STRUCTURE WITH DUMMY DIE

CROSS REFERENCE TO RELATED APPLICATIONS

This application is a Continuation application of U.S. patent application Ser. No. 15/268,843, filed on Sep. 19, 2016, now U.S. Pat. No. 9,922,964, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structures have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
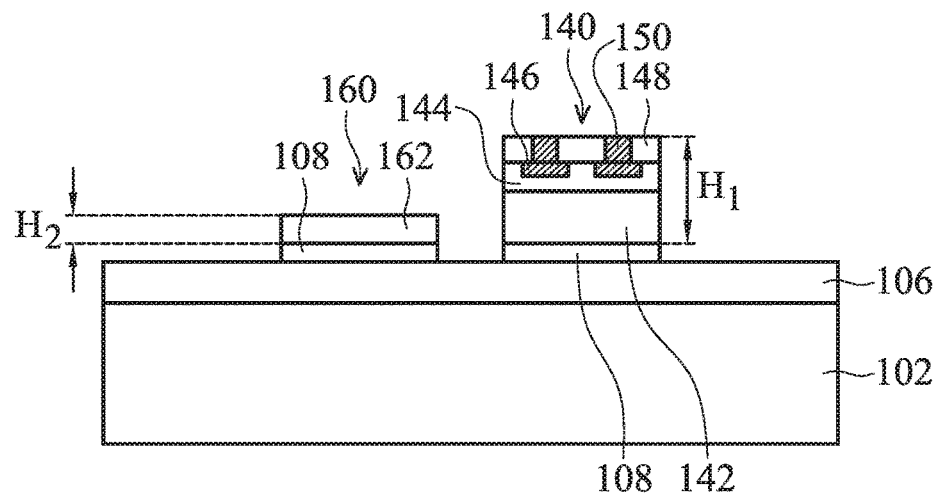
FIGS. 1A-1D show cross-sectional representations of various stages of forming a package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1D show cross-sectional representations of various stages of forming a package structure 100, in accordance with some embodiments of the disclosure.

As shown in FIG. 1A, a substrate 102 is provided. The substrate 102 may be made of silicon (Si) or other semiconductor materials, such as germanium (Ge). In some embodiments, the substrate 102 is made of a compound semiconductor such as silicon carbide, gallium arsenic, indium arsenide, or indium phosphide. The substrate 102 is a temporary support substrate. In some embodiments, the substrate 102 is made of semiconductor material, ceramic material, polymer material, metal material, another applicable material or a combination thereof. In some embodiments, the substrate 102 is a glass substrate. In some embodiments, the substrate 102 is a semiconductor substrate, such as silicon wafer.

A dielectric layer 106 is formed on the substrate 102. In some embodiments, the dielectric layer 106 is made of polymer or a polymer-containing layer. The dielectric layer 106 may be a poly-p-phenylenebenzobisthiazole (PBO) layer, a polyimide (PI) layer, a solder resist (SR) layer, an Ajinomoto buildup film (ABF), a die attach film (DAF), another applicable material, or a combination thereof.

A first device die 140 and a first dummy die 160 are formed on the dielectric layer 106 by using an adhesive layer 108 as an adhesion glue. The adhesive layer 108 includes any suitable adhesive material, such as a polymer material. In some embodiments, the adhesive layer 108 includes a double sided adhesive tape. The adhesive layer 108 is formed using a lamination process, a spin coating process, or another suitable process.

The first device die 140 includes a semiconductor substrate 142, a dielectric layer 144, a conductive pad 146, a passivation layer 148 and a connector 150. The conductive pad 146 is electrically connected to the connector 150. In some embodiments, the dielectric layer 144 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 144 is formed by a chemical vapor deposition (CVD) process, a spin-on process, a sputtering process, or a combination thereof.

In some embodiments, the passivation layer 148 is made of silicon oxide, silicon nitride, silicon oxynitride, or a combination thereof. In some other embodiments, the passivation layer 148 is made of polymer. In some embodiments, the passivation layer 148 is formed by a chemical vapor deposition (CVD) process, a spin-on process, a sputtering process, or a combination thereof.

Other device elements may be formed in the first device die 140. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The first dummy die 160 includes a substrate 162. The substrate 162 may be made of silicon (Si) or other semiconductor materials, such as germanium (Ge). In some embodiments, the substrate 162 is made of a compound semiconductor such as silicon carbide, gallium arsenic, indium arsenide, or indium phosphide.

The first dummy die 160 does not provide any function, and no connectors are formed on the top of the first dummy die 160. The first dummy die 160 is used to reduce the asymmetric warpage (in X- and Y-direction) or bending stress on the substrate 102. The coefficient of thermal expansion (CTE) of the first dummy die 160 is substantially identical to or similar to the coefficient of thermal expansion (CTE) of the first device die 140. In some embodiments, the first dummy die 160 is made of silicon. If the coefficient of thermal expansion (CTE) of the first dummy die 160 differs significantly from that of the first device die 140, the first dummy die 160 may not compensate for the stress. Therefore, the asymmetric warpage in wafer level package level or package (PKG) level may occur and resulted in yield loss during wafer level process and PKG joint process.

The top surface of the first device die 140 is higher than the top surface of the first dummy die 160. More specifically, a top surface of the passivation layer 148 is higher than the top surface of the first dummy die 160. The first device die 140 has a first height $H_1$ in a Z-direction, and the first dummy die 160 has a second height $H_2$ in a Z-direction (the Z-direction is perpendicular to a top surface of the substrate 102). The second height $H_2$ is smaller than the first height $H_1$. In some embodiments, a height ratio of the second height $H_2$ to the first height $H_1$ is in a range from about 65% to about 85%. If the ratio is greater than 85%, the risky level of cracks forming in the redistribution structure formed above the interface between the first dummy die 160 and a package layer (formed later) may become serious. If the ratio is smaller than 65%, the suppression of asymmetric warpage may not be significant.

Figure 1B:
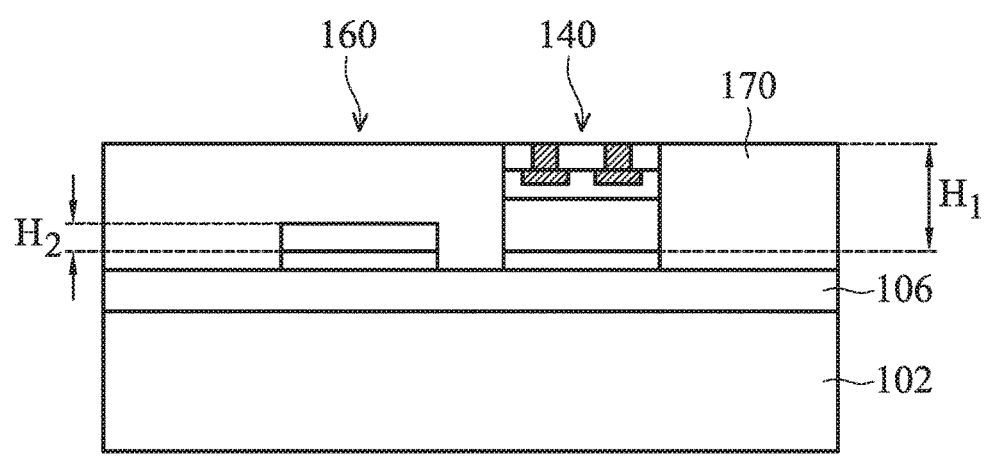

After the first device die 140 and a first dummy die 160 are formed, a package layer 170 is formed between the first device die 140 and the first dummy die 160, as shown in FIG. 1B, in accordance with some embodiments of the disclosure. In other words, the first device die 140 and the first dummy die 160 are surrounded by the package layer 170.

In some embodiments, the package layer 170 is made of a molding compound, such as liquid epoxy, deformable gel, silicon rubber, or the like. In some embodiments, the molding compound is dispensed over the first device die 140 and a first dummy die 160, and therefore a thermal process is performed to harden the molding compound. A planarizing process is performed to expose the top surface of the connector 150. After the planarizing process, the top surface of the first device die 140 is substantially leveled with that of the package layer 170. In some embodiments, the planarizing process includes grinding process, a chemical mechanical polishing (CMP) process, an etching process, another applicable process or a combination thereof.

Figure 1C:
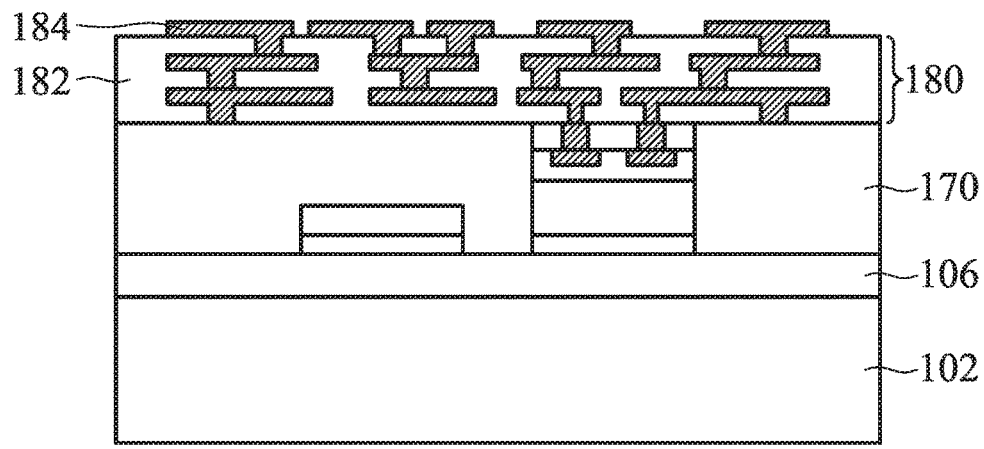

Afterwards, a redistribution structure 180 is formed on the package layer 170, the first device die 140 and the first dummy die 160, as shown in FIG. 1C, in accordance with some embodiments of the disclosure. The redistribution structure 180 includes one or more redistribution lines (RDL) and one or more passivation layers. The redistribution structure 180 includes the redistribution lines (RDL) 184 formed in the passivation layer 182.

In some embodiments, the redistribution lines (RDL) 184 are made of metal materials, such as copper (Cu), copper alloy, aluminum (Al), aluminum alloy, tungsten (W), tungsten alloy, titanium (Ti), titanium alloy, tantalum (Ta), or tantalum alloy. In some embodiments, the RDL 184 is formed by plating, electroless plating, sputtering or chemical vapor deposition (CVD). In some embodiments, the passivation layer 182 is made of organic materials, such as polybenzoxazole (PBO), benzocyclobutene (BCB), polyimides (PI), silicone, acrylates, siloxane, or a combination thereof. In some other embodiments, the passivation layer 182 is made of non-organic materials, such as silicon oxide, un-doped silicate glass, silicon oxynitride, solder resist (SR), silicon nitride, HMDS (hexamethyldisilazane).

Figure 1D:
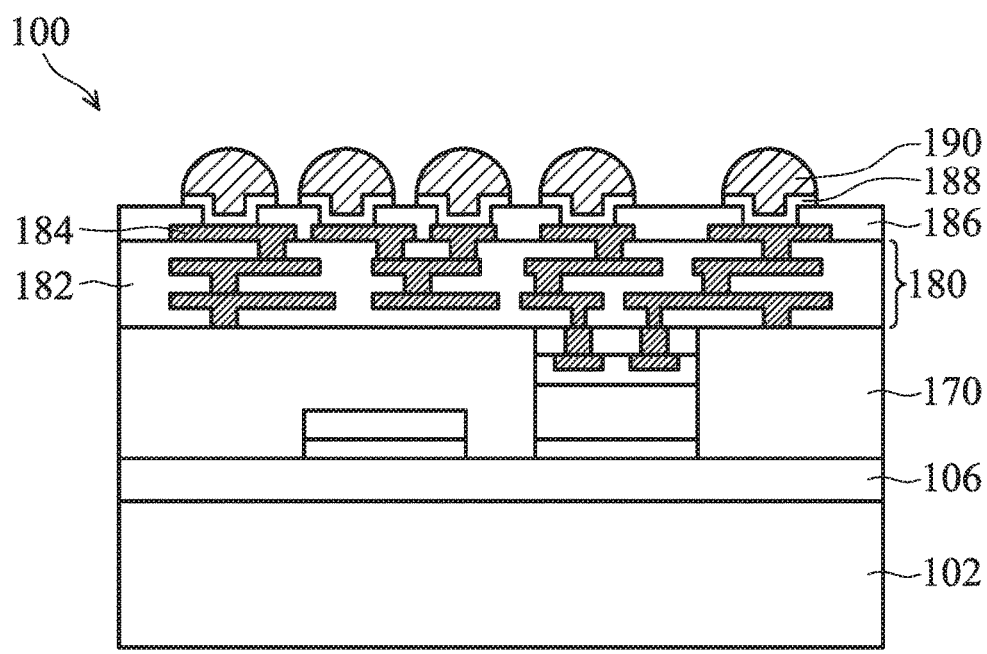

Afterwards, a top passivation layer 186 is formed on the redistribution lines (RDL) 184, as shown in FIG. 1D, in accordance with some embodiments of the disclosure. In some embodiments, the top passivation layer 186 is made of organic materials, such as polybenzoxazole (PBO), benzocyclobutene (BCB), polyimide (PI), silicone, acrylates, siloxane, or a combination thereof. In some other embodiments, the top passivation layer 186 is made of non-organic materials, such as silicon oxide, un-doped silicate glass, silicon oxynitride, solder resist (SR), silicon nitride, HMDS (hexamethyldisilazane).

An under bump metallurgy (UBM) layer 188 is formed in the passivation layer 186, and an electrical connector 190 is formed on the UBM layer 188. The electrical connector 190 is electrically connected to the redistribution lines (RDL) 184. Therefore, the package structure 100 is obtained.

After the package structure 100 is formed, a reliability test is performed on the package structure 100 to confirm the function of the package structure 100 to predict mean-time to failure (MTFF) of package structure 100. The reliability test includes a thermal-cycle process. When the package structure 100 is under the thermal-cycle process, the package layer 170 and the first device die 140 may expand at different rates since the package layer 170, the first device die 140 and the first dummy die 160 each have different coefficients of thermal expansion (CTE). Therefore, the stress is concentrated on the interface between the package layer 170 and the first device die 140. As a result, the redistribution lines (RDL) 184 directly above the interface between the package layer 170 and the first device die 140 may crack due to the concentration of stress. The cracking phenomenon will become serious especially at portions of the redistribution lines (RDL) 184 which are directly over the corners of the first device die 140. When the second height ($H_2$) equals to that of the first device die ($H_1$), the cracking phenomenon will appear on the first dummy die 160.

In order to prevent cracking, the first dummy die 160 with a smaller height $H_2$ is formed adjacent to the first device die 140. The interface between the first dummy die 160 and the package layer 170 is relatively far away from the redistribution lines (RDL) 184 to reduce cracking risk, compared with the first dummy die 160 having a height that is the same as the first device die 140.

In some embodiments, a height ratio of the second height $H_2$ to the first height $H_1$ is in a range from about 65% to about 85%. If the ratio is greater than 85%, the problem of cracking may become serious. If the ratio is less than 65%, warpage may occur.

Figure 2A:
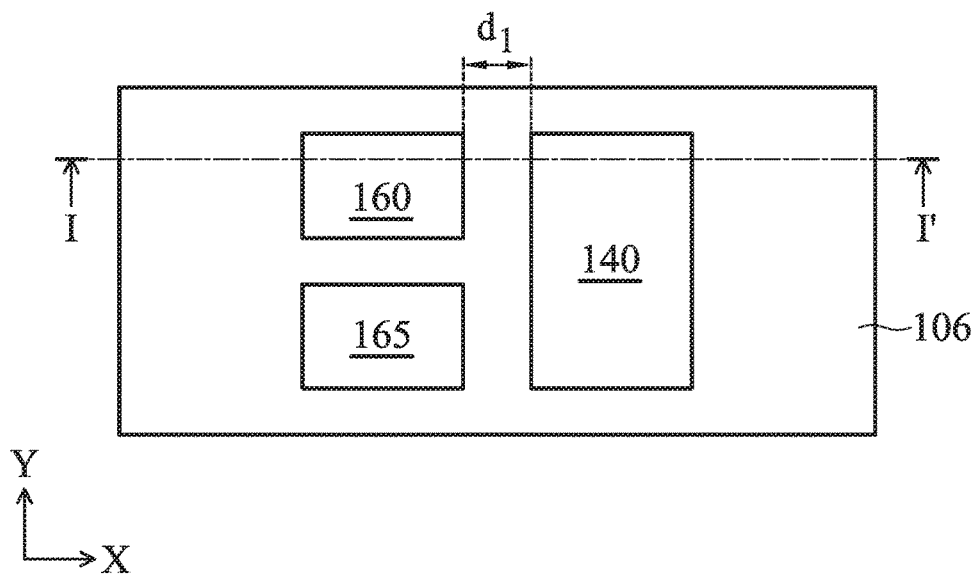
FIG. 2A shows a top-view of the first device die and the first dummy die, in accordance with some embodiments of the disclosure.

FIG. 2A shows a top-view of the first device die 140 and the first dummy die 160, in accordance with some embodiments of the disclosure. FIG. 1A shows a cross-sectional representation along line I-I' shown in FIG. 2A.

As shown in FIG. 2A, the first device die 140, the first dummy die 160 and the third device die 165 are formed on the substrate 102. The top-view shape of the first dummy die 160 may be a rectangle, square, circle, or the like. The top-view shape of the first dummy die 160 depends on the top-view shape of the first device die 140 and the third device die 165. If no dummy die is present on the substrate 102 and adjacent to the first device die 140 and the third device die 165, the stresses in the X-direction are not equal to the stresses in the Y-direction. Therefore, when the package structure 100 is under thermal-cycle process (the cycle of high temperature and the low temperature), asymmetric warpage or bending problems may occur due to the unequal distribution of stresses.

The first function of the first dummy die 160 is to balance the distribution of stress to prevent asymmetric warpage in wafer level package or package (PKG) level. In addition, the bending stress on the substrate 102 is also decreased by using the first dummy die 160 due to less volume of the package layer 170, which has large CTE. The second function of the first dummy die 160 with less height ($H_2$) than the first height of first device die 140 ($H_1$) is to reduce the risk of cracking in the redistribution lines (RDL) 184 which are directly above the interface between the first dummy die 160 and the package layer 170.

In some embodiments, the spacing distance $d_1$ between the first device die 140 and the first dummy die 160 is in a range from about 50 μm to about 100 μm. If the spacing distance $d_1$ is greater than 100 μm, the die to die (D2D) talking distance becomes longer and results in significant signal delay at high operating frequency. If the spacing distance $d_1$ is less than 50 μm, the control of the accuracy of die placement process becomes a challenge.

Figure 2B:
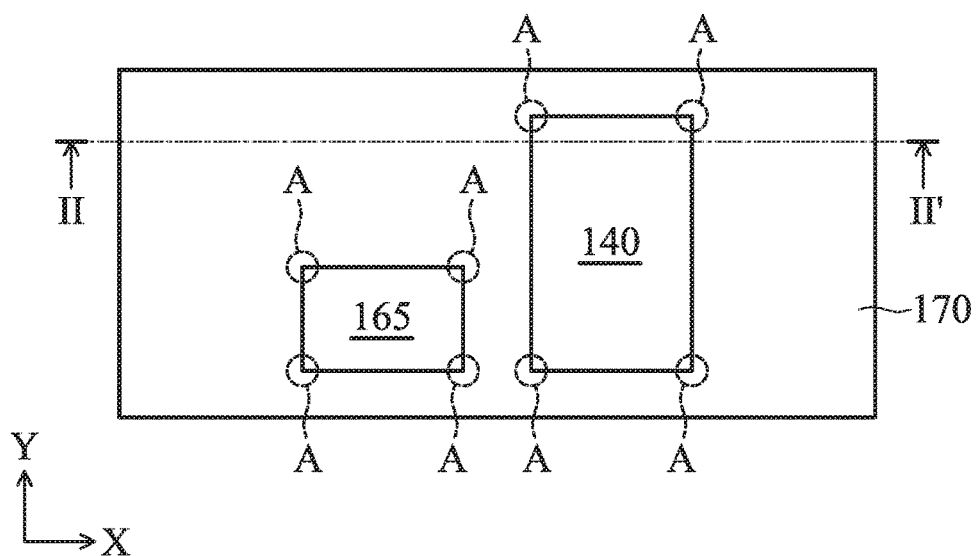
FIG. 2B shows a top-view of the first dummy die covered by the package layer, in accordance with some embodiments of the disclosure.

FIG. 2B shows a top-view of the first dummy die 160 covered by the package layer 170, in accordance with some embodiments of the disclosure. FIG. 1B shows a cross-sectional representation along line II-II' shown in FIG. 2B.

As shown in FIG. 2B, the first dummy die 160 is covered by the package layer 170, and therefore a top surface of the first device die 140 and a top surface of the third device die 165 are exposed.

A Keep-Out Zone (KOZ) is a region defined around the dies (e.g., 140,160) where no other devices can be placed within. The RDL lines 184 of the redistribution structure 180 directly above the KOZ regions may easily crack because of the stress concentrated on the KOZ regions. During fabricating the package structure 100, some thermal process may perform on the first device die 140, the first dummy die 160 and the package layer 170. The package layer 170 and the first device die 140 may expand at different rates since the package layer 170, the first device die 140 and the first dummy die 160 each have different coefficients of thermal expansion (CTE). As a result, the stresses are concentrated on the KOZ regions where are close to the first device die 140. If the first dummy die 160 and the first device die 140 have the same height, there are twelve KOZ regions (every die has four KOZ corners). However, as shown in FIG. 2B, since the first dummy die 160 with a lower height is covered by the package layer 170, there are eight Keep-Out Zone (KOZ) regions (the circle region A), rather than twelve Keep-Out Zone (KOZ) regions. Therefore, when the number of the KOZ regions is reduced, the problem of cracking of the RDL lines 184 of the redistribution structure 180 is reduced.

FIGS. 3A-3G show cross-sectional representations of various stages of forming a package structure 200, in accordance with some embodiments of the disclosure.

Figure 3A:
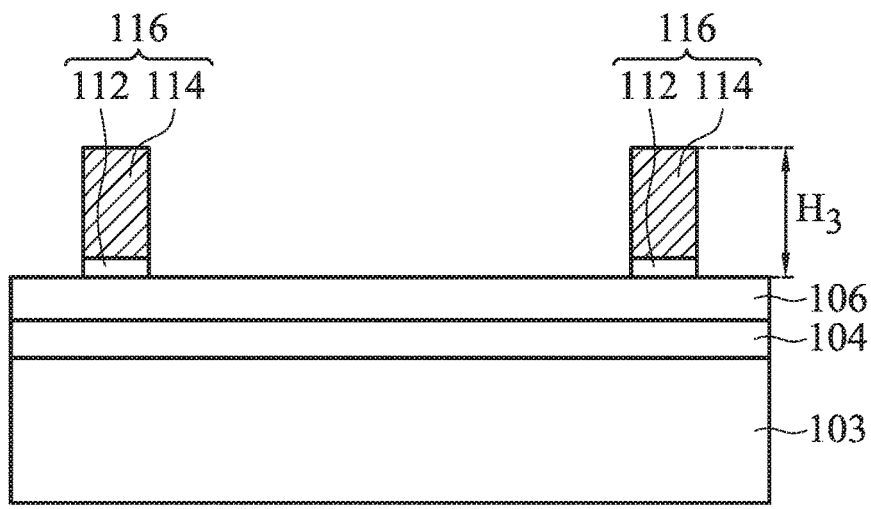
FIGS. 3A-3G show cross-sectional representations of various stages of forming a package structure, in accordance with some embodiments of the disclosure.

As shown in FIG. 3A, a release layer 104 is formed on a carrier substrate 103. The carrier substrate 103 is configured to provide temporary mechanical and structural support during subsequent processing steps. In some embodiments, the carrier substrate 103 includes glass, silicon oxide, aluminum oxide, a combination thereof, and/or the like, in accordance with some embodiments. In some other embodiments, the carrier substrate 103 includes a wafer.

The release layer 104 may be made of glue, or may be a lamination material, such as a foil. In some embodiments, the release layer 104 is photosensitive and is easily detached from the carrier substrate 103 by light irradiation. For example, ultra-violet (UV) light or laser light is used to detach the release layer 104. In some embodiments, the release layer 104 is a light-to-heat-conversion (LTHC) coating. In some other embodiments, the release layer 104 is heat-sensitive and is easily detached from the carrier substrate 103 when it is exposed to heat.

The dielectric layer 106 is formed on the release layer 104. The dielectric layer 106 is made of polymer or a polymer-containing layer. The dielectric layer 106 may be a poly-p-phenylenebenzobisthiazole (PBO) layer, a polyimide (PI) layer, a solder resist (SR) layer, an Ajinomoto buildup film (ABF), a die attach film (DAF), another applicable material, or a combination thereof.

A seed layer 112 is formed over the dielectric layer 106. Afterwards, a mask layer (not shown) is formed on the seed layer 112, and opening is formed in the mask layer to expose the seed layer 112. Afterwards, a conductive structure 114 is formed in the opening. As a result, the conductive structure 114 is formed on the seed layer 112. The conductive structure 114 and the seed layer 112 are in combination referred to as through InFO vias (TIV) 116, which are also referred to as through vias 116. In some embodiments, the conductive structure 114 and the seed layer 112 are made of the same material, and therefore there is no distinguishable interface therebetween. In some embodiments, the through vias 116 have a third height $H_3$ in the Z-direction.

In some embodiments, the seed layer 112 is made of metal material, such as copper (Cu), titanium (Ti), copper alloy, titanium alloy, or a combination thereof. In some embodiments, the seed layer 112 is formed by a deposition process, such as a chemical vapor deposition process (CVD), physical vapor deposition process (PVD), another applicable process, or a combination thereof. The conductive structure 114 may be made of metal material, such as copper (Cu), aluminum (Al), tungsten (W), nickel (Ni), an alloy thereof, or a combination thereof. In some embodiments, the conductive structure 114 is formed by a plating process.

Figure 3B:
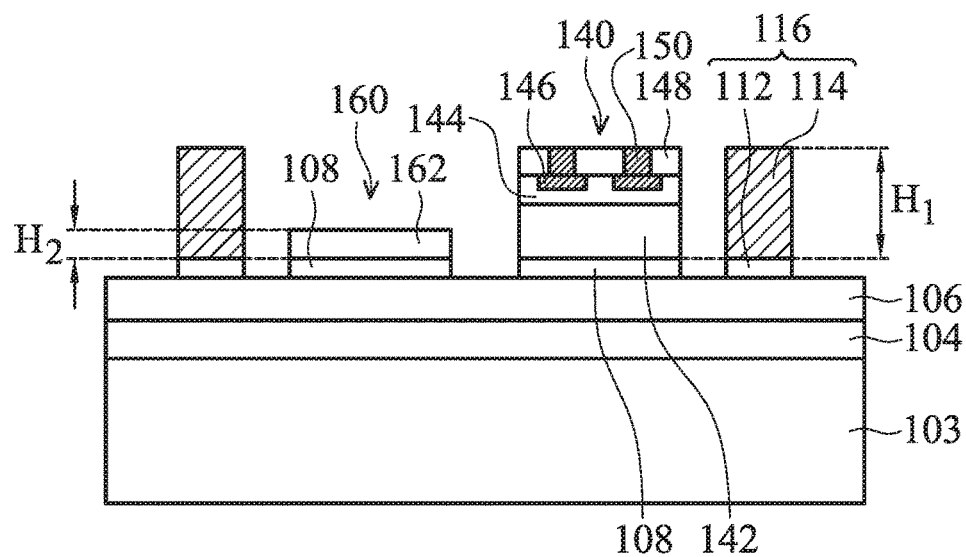

After the through vias 116 are formed, the first device die 140 and the first dummy die 160 are formed on the dielectric layer 106 by using the adhesive layer 108 as the adhesive glue, as shown in FIG. 3B, in accordance with some embodiments of the disclosure. In some embodiments, the adhesive layer 108 is die attach film (DAF).

It should be noted that the first device die 140 has a first height $H_1$, and the first dummy die 160 has a second height $H_2$. The first height $H_1$ is greater than the second height $H_2$. The third height $H_3$ is greater than the first height $H_1$. In some embodiments, a height ratio of the second height $H_2$ to the first height $H_1$ is in a range from about 65% to about 85%. If the ratio is greater than 85%, the problem of cracks forming in the redistribution structure formed above the interface between package layer 170 (formed later) and first device die 140 may become serious. If the ratio is smaller than 65%, warpage may occur.

Figure 3C:
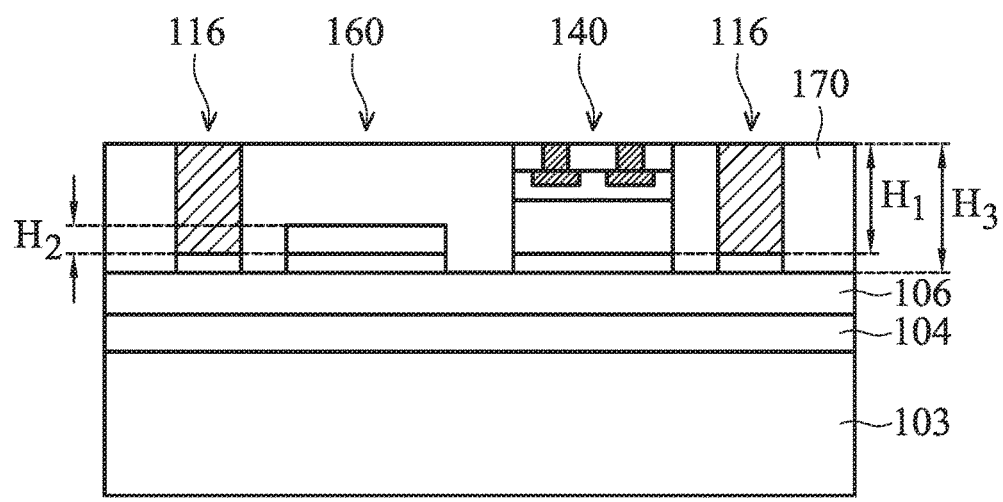

Afterwards, the package layer 170 is formed over the first device die 140 and the first dummy die 160. In some embodiments, the package layer 170 completely encapsulates and covers the first device die 140, the first dummy die 160, and the through vias (TIVs) 116. The package layer 170 is in direct contact with the first dummy die 160. Afterwards, a planarizing process is performed on the package layer 170 to expose the top surface of the first device die 140 and the top surface of the through vias 116, as shown in FIG. 3C, in accordance with some embodiments of the disclosure.

It should be noted that the first dummy die 160 is covered by the package layer 170. The top surface and the sidewalls of the first dummy die 160 is surrounded or encapsulated by the package layer 170, and only the bottom surface of the first dummy die 160 is not in contact with the package layer 170.

In some embodiments, the package layer 170 is made of a molding compound, such as liquid epoxy, deformable gel, silicon rubber, or the like. In some embodiments, the molding compound is dispensed over the dielectric layer 106, the first device die 140 and the first dummy die 160 and therefore a thermal process is performed to harden the molding compound. After the planarizing process, the top surface of the first device die 140 is substantially level with that of the through vias 116. In some embodiments, the planarizing process includes a grinding process, a chemical mechanical polishing (CMP) process, an etching process, another applicable process, or a combination thereof.

Figure 3D:
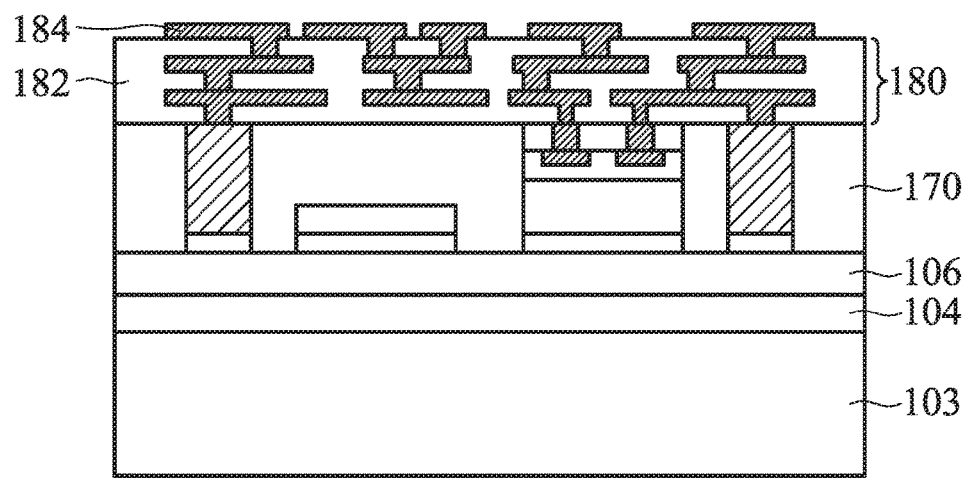

Afterwards, the redistribution structure 180 is formed on the package layer 170, the first device die 140 and the first dummy die 160, as shown in FIG. 3D, in accordance with some embodiments of the disclosure. The redistribution structure 180 includes one or more redistribution lines (RDL) and one or more passivation layers. The redistribution structure 180 includes the redistribution lines (RDL) 184 formed in the passivation layer 182.

Figure 3E:
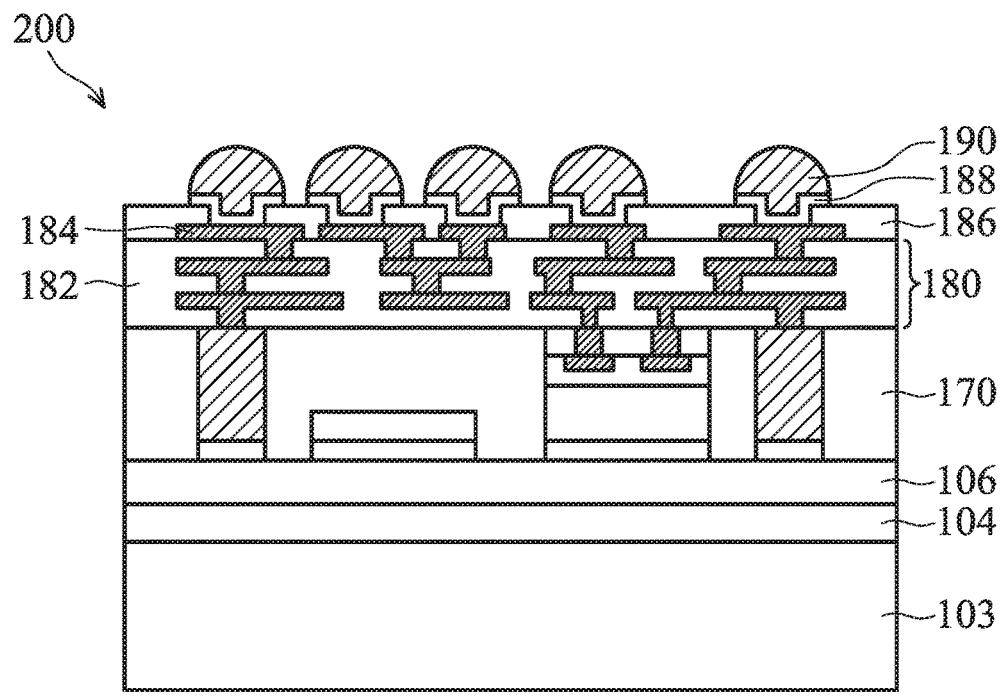

Afterwards, the passivation layer 186 is formed on the redistribution lines (RDL) 184, as shown in FIG. 3E, in accordance with some embodiments of the disclosure. The under bump metallurgy (UBM) layer 188 is formed in the passivation layer 186, and the electrical connector 190 is formed on the UBM layer 188. The electrical connector 190 is electrically connected to the redistribution lines (RDL) 184. Therefore, the package structure 200 is obtained. In some embodiments, the package structure 200 is a fan-out wafer level package structure. The fan-out wafer level package means that the I/O pads on the die structure can be distributed to a greater area than the die structure, and hence the number of I/O pads on the surface of the die structure can be increased.

Figure 3F:
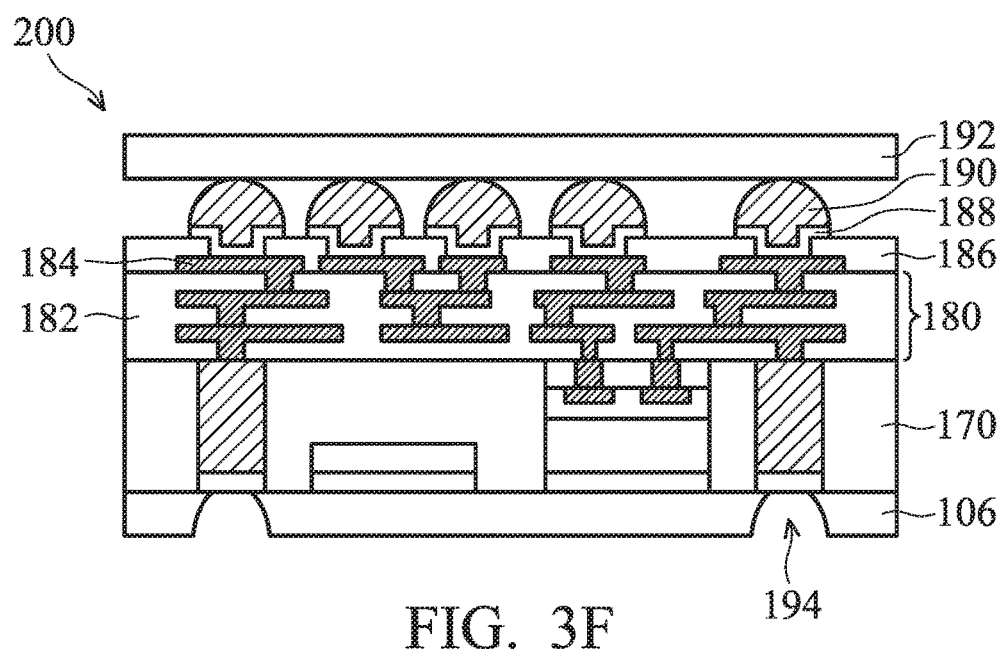

After the electrical connector 190 is formed, and the carrier substrate 103 and the release layer 104 are removed, as shown in FIG. 3F, in accordance with some embodiments of the disclosure. Afterwards, the electrical connector 190 is attached to a carrier 192. The carrier substrate 103 is removed by projecting a UV light or a laser on the release layer 104, such that the release layer 104 is decomposed. The carrier 192 includes a tape which is photosensitive or heat-sensitive and is easily detached from the electrical connector 190.

Afterwards, a portion of the dielectric layer 106 is removed to form openings 194. In some embodiments, the seed layer 108 is not removed or completely removed. In some other embodiments, a portion of the seed layer 112 is removed, and the remaining seed layer 112 is exposed. In some other embodiments, the opening 194 is formed by a laser drilling process, an etching process, or another applicable process.

Figure 3G:
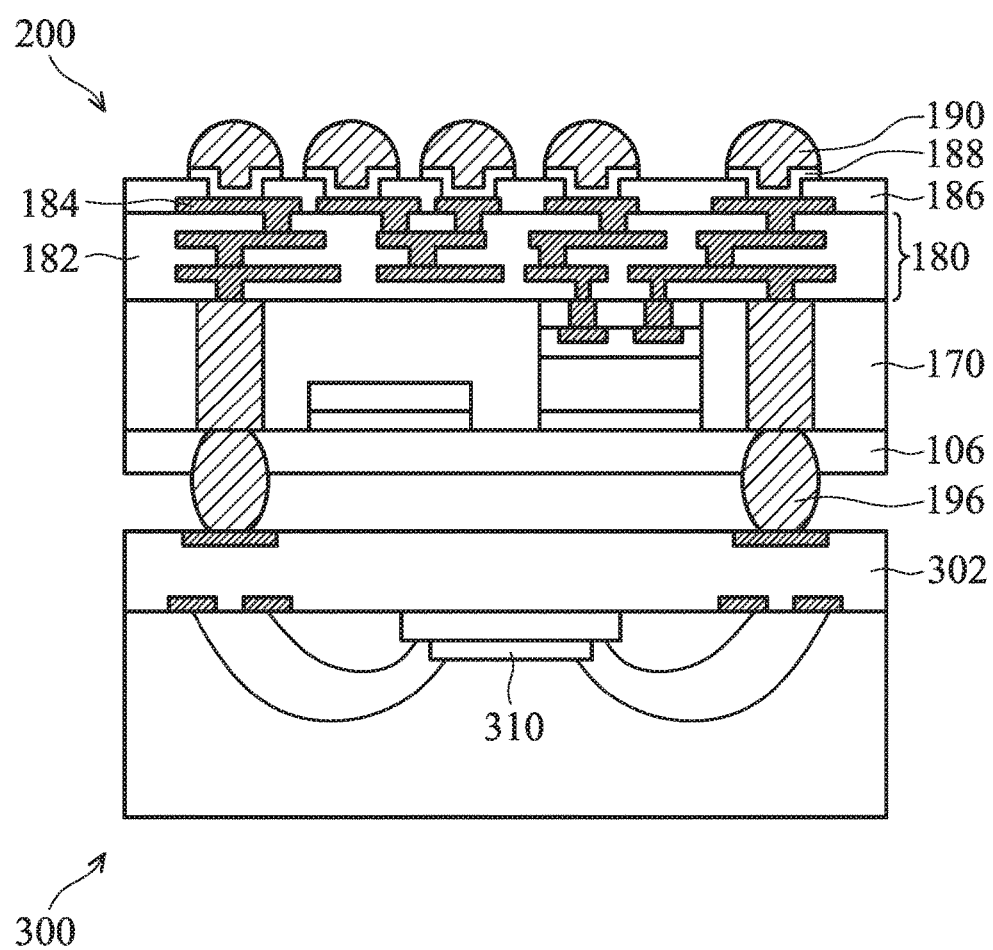

After the opening 194 is formed, an electrical connector 196 is filled into the opening 194, as shown in FIG. 3G, in accordance with some embodiments of the disclosure. Afterwards, the top package 300 is bonded to the package structure 200 by the electrical connector 196. Before the electrical connector 196 is filled into the opening 194, a solder paste (not shown) is pre-formed in the opening 194 by a print or jetting process.

The top package 300 includes a package substrate 302 and device dies 310. The bonding of the device dies 310 to the package substrate 302 may be achieved through wire-bonding, flip-chip bonding or the like. In some embodiments, the device dies 310 includes memory dies, such as Static Random Access Memory (SRAM) die, Dynamic Random Access Memory (DRAM) die or the like.

Afterwards, the package structure 200 may continue to undergo other processes to form other structures or devices. Afterwards, a dicing process is performed to separate the structure into chip packages.

In some embodiments, the CTE of the package layer 170 is higher than the CTE of the first dummy die 160, and the CTE of the first dummy die 160 is similar to the CTE of the first device die 140. For example, the CTE of the package layer 170 made of molding compound is in a range from about 5 ppm/° C.-to 10 ppm/° C. before glass transition temperature (Tg), and the CTE of the first dummy die 160 made of silicon die is in a range from about 2.5 ppm/° C. to about 3.5 ppm/° C. before Tg. The stress may concentrate on the interface between the first dummy die 160 and the package layer 170 due to the mismatch of the CTE. Therefore, when the top surface of the first dummy die 160 is lower than the top surface of the first device die 140, the interface of the first dummy die 160 and the package layer 170 is far away from the first metal layer (M1) of the redistribution lines (RDL) 184 of the redistribution structure 180. Cracking of the redistribution lines (RDL) 184 of the redistribution structure 180 may be reduced, and the performance of the package structure 200 is improved.

FIGS. 4A-4G show cross-sectional representations of various stages of forming a package structure 400, in accordance with some embodiments of the disclosure. Some processes and materials used to form the package structure 400 are similar to, or the same as, those used to form package structure 200 and are not repeated herein.

Figure 4A:
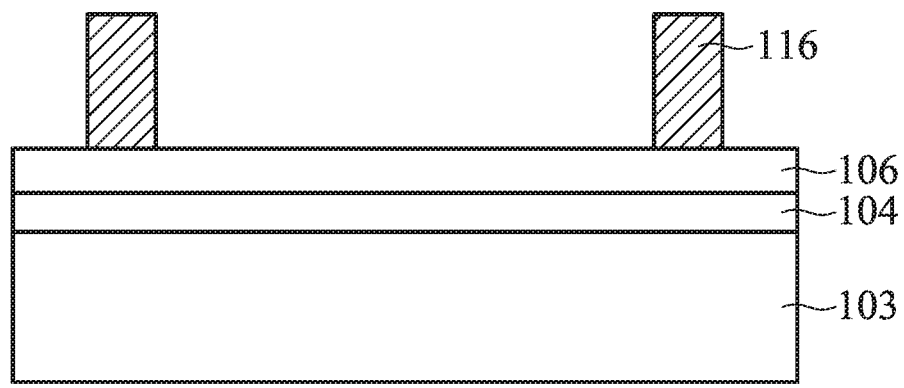
FIGS. 4A-4G show cross-sectional representations of various stages of forming a package structure, in accordance with some embodiments of the disclosure.

As shown in FIG. 4A, the release layer 104 is formed on the carrier substrate 103. In some embodiments, the carrier substrate 103 includes glass, silicon oxide, aluminum oxide, a combination thereof, and/or the like, in accordance with some embodiments. In some other embodiments, the carrier substrate 103 includes a wafer.

The dielectric layer 106 is formed on the release layer 104. The through vias 116 are formed on the dielectric layer 106. The through vias 116 are made of conductive materials.

Figure 4B:
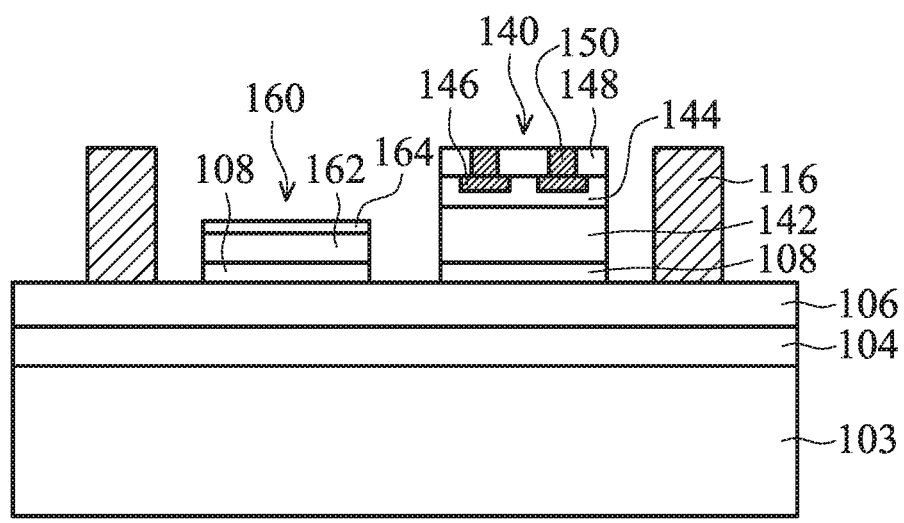

Afterwards, the first device die 140 and the first dummy die 160 are formed on the dielectric layer 106 by the adhesive layer 108, as shown in FIG. 4B, in accordance with some embodiments of the disclosure. The first dummy die 160 includes the substrate 162 and a buffer layer 164.

The buffer layer 164 is used to protect the substrate 162 from being damaged or cracked during thinning process. In some embodiments, the buffer layer 164 is made of polymer, such as poly-p-phenylenebenzobisthiazole (PBO) or polyimide (PI). In some other embodiments, the buffer layer 164 is made of silicon oxide, silicon nitride, silicon oxynitride, or a combination thereof. In some embodiments, the buffer layer 164 and the passivation layer 148 are made of the same materials.

It should be noted that the first device die 140 has a first height $H_1$, and the first dummy die 160 has a second height $H_2$. The second height $H_2$ is smaller than the first height $H_1$ to reduce the cracking of the RDL lines 184 which are directly above the interface between the package layer 170 and the first dummy die 160.

Figure 4C:
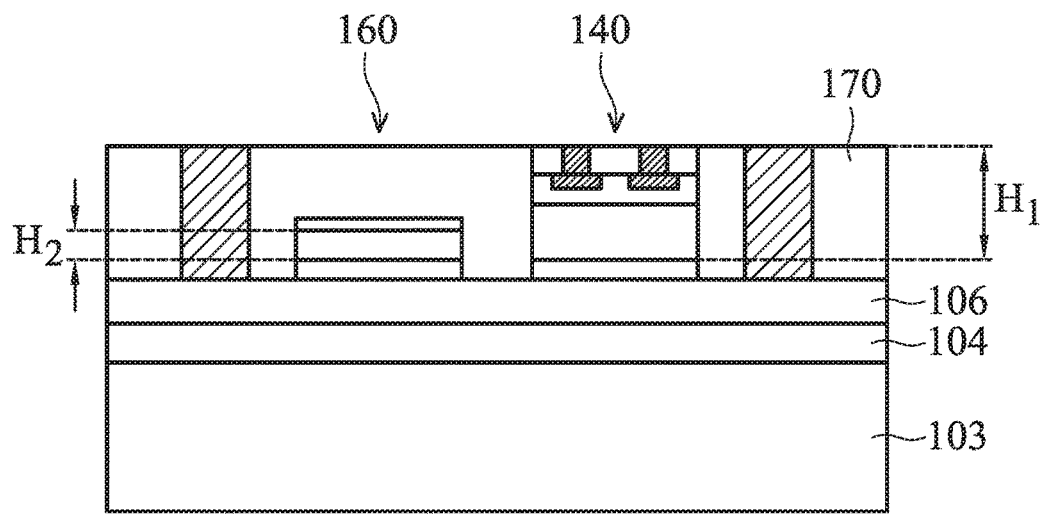

After the first device die 140 and the first dummy die 160 are formed, the package layer 170 is formed between the first device die 140 and the first dummy die 160, as shown in FIG. 4C, in accordance with some embodiments of the disclosure. In other words, the first device die 140 and the first dummy die 160 are surrounded by the package layer 170.

Figure 4D:
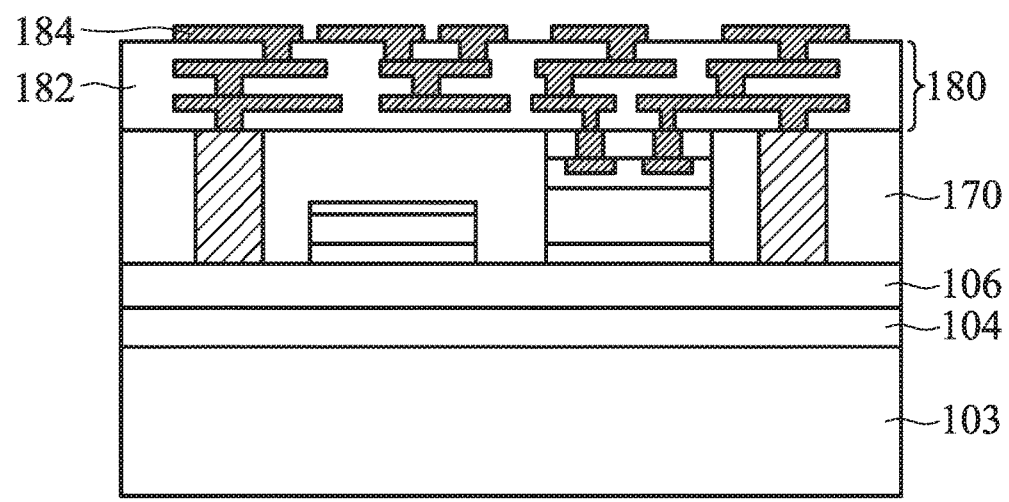

Afterwards, the redistribution structure 180 is formed on the package layer 170, the first device die 140 and a first dummy die 160, as shown in FIG. 4D, in accordance with some embodiments of the disclosure. The redistribution structure 180 includes one or more redistribution lines (RDL) and one or more passivation layers. The redistribution structure 180 includes the redistribution lines (RDL) 184 formed in the passivation layer 182.

Figure 4E:
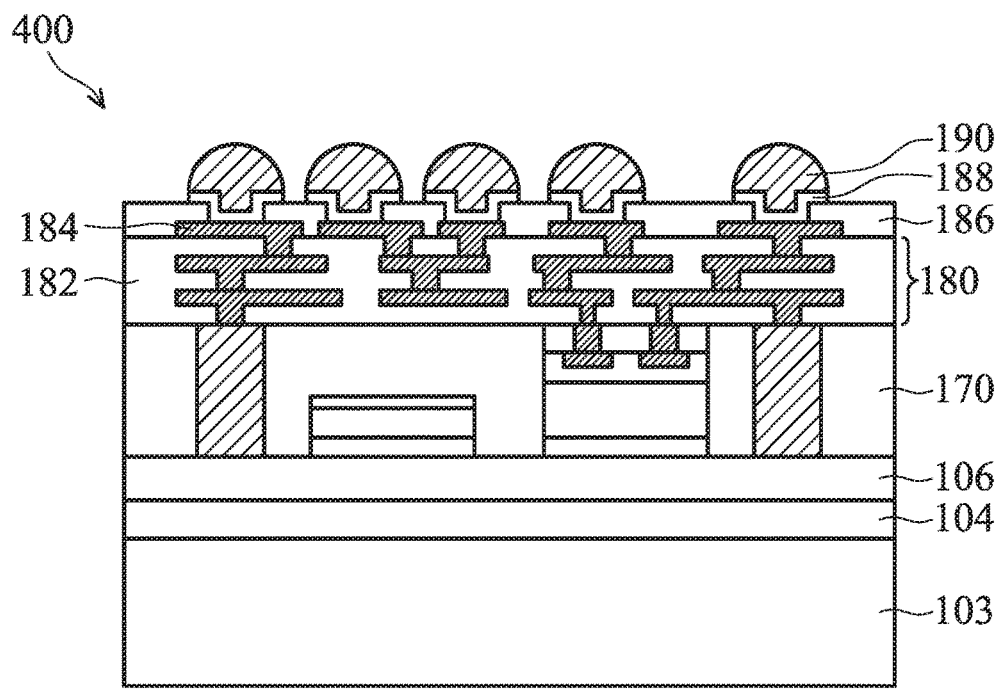

Afterwards, the passivation layer 186 is formed on the redistribution lines (RDL) 184, as shown in FIG. 4E, in accordance with some embodiments of the disclosure. The under bump metallurgy (UBM) layer 188 is formed in the passivation layer 186, and the electrical connector 190 is formed on the UBM layer 188. The electrical connector 190 is electrically connected to the redistribution lines (RDL) 184. Therefore, the package structure 400 is obtained.

Figure 4F:
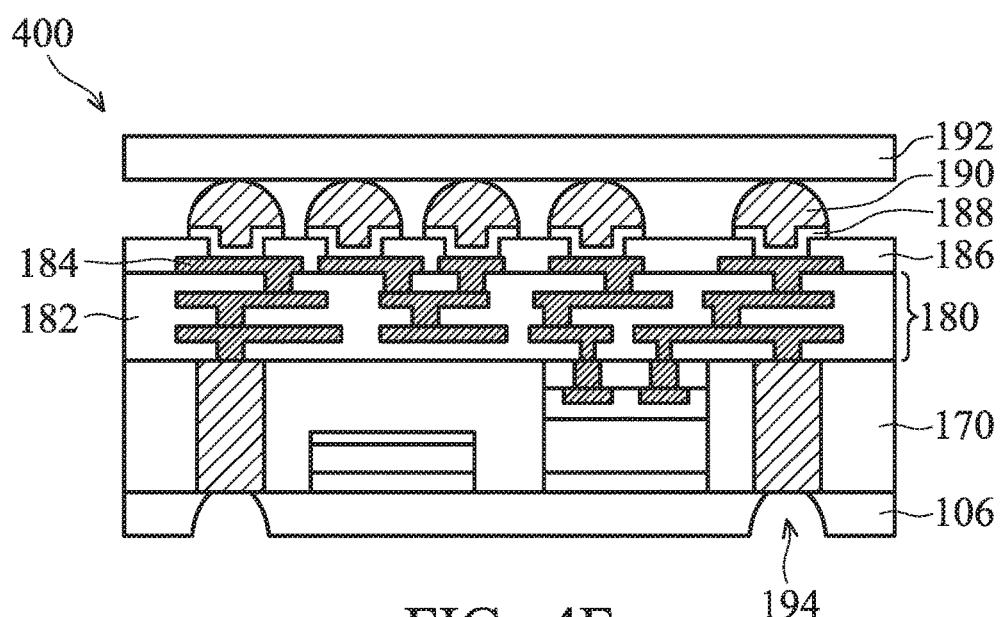

After the electrical connector 190 is formed, the carrier substrate 103 and the release layer 104 are removed, as shown in FIG. 4F, in accordance with some embodiments of the disclosure. Afterwards, the electrical connector 190 is attached to a carrier 192. Afterwards, a portion of the dielectric layer 106 is removed to form openings 194.

Figure 4G:
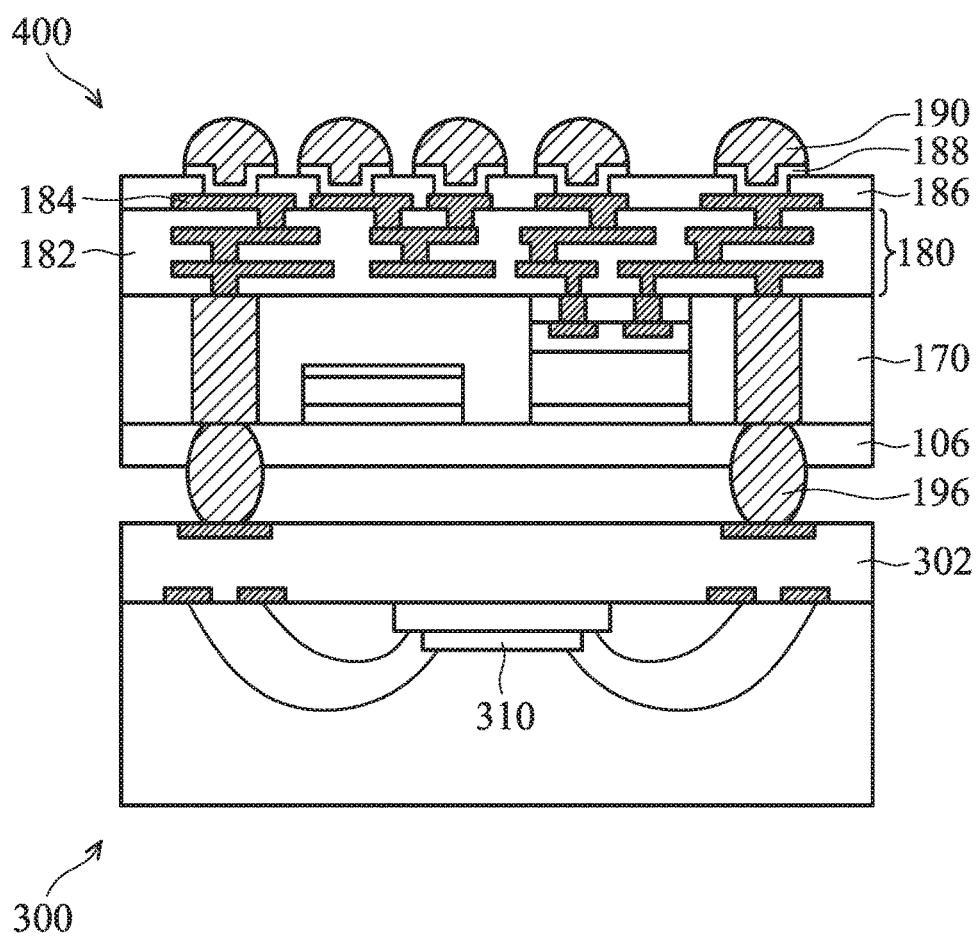

After the opening 194 is formed, the electrical connector 196 is filled into the opening 194, as shown in FIG. 4G, in accordance with some embodiments of the disclosure. Afterwards, the top package 300 is bonded to the package structure 400 by the electrical connector 196. The top package 300 includes a package substrate 302 and device dies 310.

It should be noted that the buffer layer 164 is formed on the substrate 162 to protect the substrate 162 from being damaged, especially when the substrate 162 has a smaller height. The top surface of the buffer layer 164 is still lower than the top surface of the first device die 140. Therefore, the problem of the redistribution structure cracking is reduced.

FIGS. 5A-5G show cross-sectional representations of various stages of forming a package structure 500, in accordance with some embodiments of the disclosure. Some processes and materials used to form the package structure 500 are similar to, or the same as, those used to form package structure 200 and are not repeated herein.

Figure 5A:
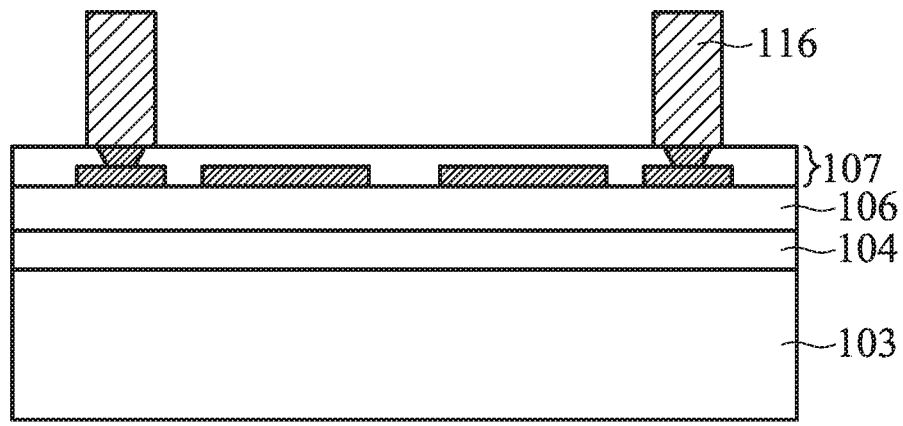
FIGS. 5A-5G show cross-sectional representations of various stages of forming a package structure, in accordance with some embodiments of the disclosure.

As shown in FIG. 5A, the release layer 104 is formed on the carrier substrate 103. The dielectric layer 106 is formed on the release layer 104. A backside redistribution structure 107 is formed on the dielectric layer 106. The backside redistribution structure 107 includes one or more redistribution lines (RDL) and one or more passivation layers. The redistribution structure 107 includes the redistribution lines (RDL) formed in the passivation layer. In some embodiments, the redistribution lines (RDL) are made of metal materials, such as copper (Cu), copper alloy, aluminum (Al), aluminum alloy, tungsten (W), tungsten alloy, titanium (Ti), titanium alloy, tantalum (Ta), or tantalum alloy.

The through vias 116 are formed on the redistribution structure 107. The through vias 116 are made of conductive materials. The through vias 116 are electrically connected to the redistribution structure 107.

Figure 5B:
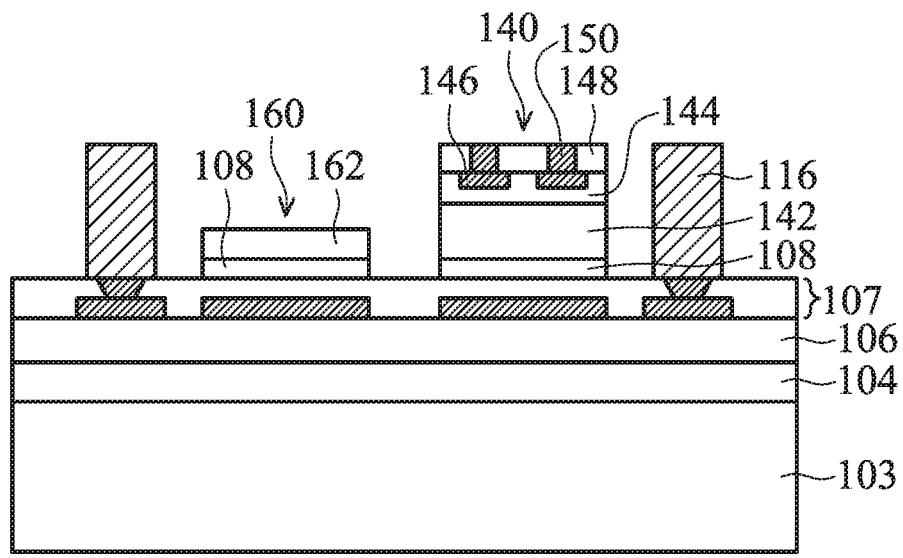

Afterwards, the first device die 140 and the first dummy die 160 are formed on redistribution structure 107 by the adhesive layer 108, as shown in FIG. 5B, in accordance with some embodiments of the disclosure. The first dummy die 160 includes the substrate 162. In some other embodiments, a buffer layer is formed on the substrate 162.

Figure 5C:
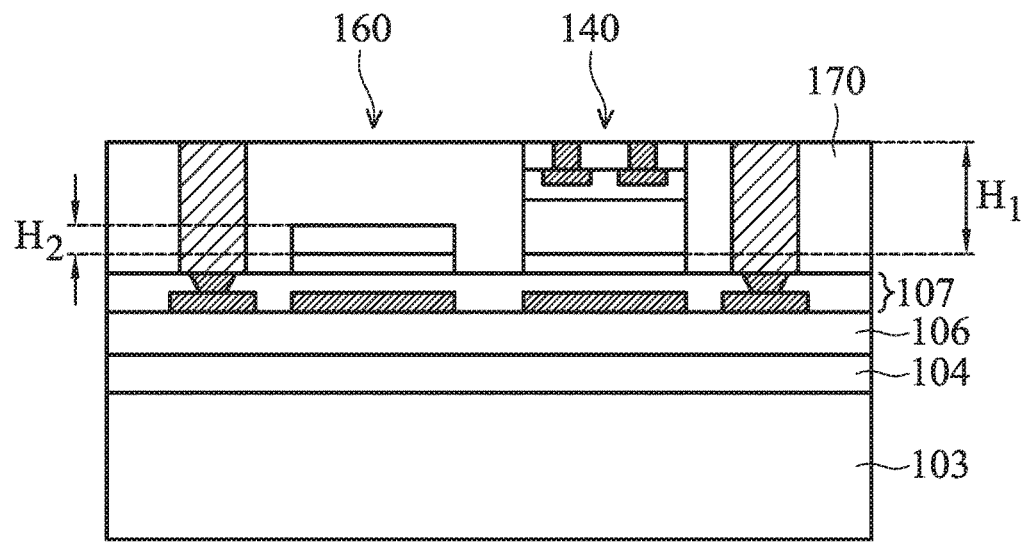

Afterwards, the package layer 170 surrounds the first device die 140 and the first dummy die 160, as shown in FIG. 5C, in accordance with some embodiments of the disclosure.

Figure 5D:
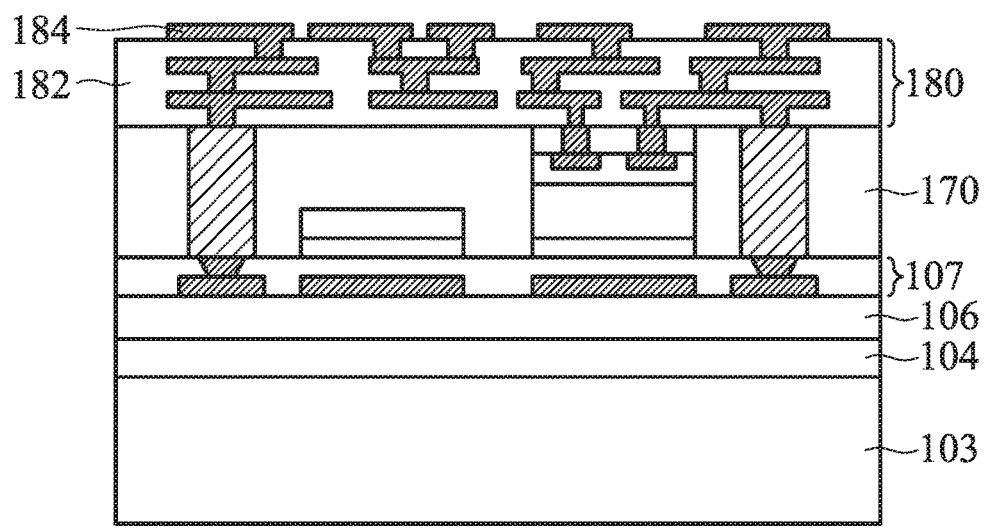

Afterwards, the redistribution structure 180 is formed on the package layer 170, the first device die 140 and a first dummy die 160, as shown in FIG. 5D, in accordance with some embodiments of the disclosure. The redistribution structure 180 includes the redistribution lines (RDL) 184 formed in the passivation layer 182.

Figure 5E:
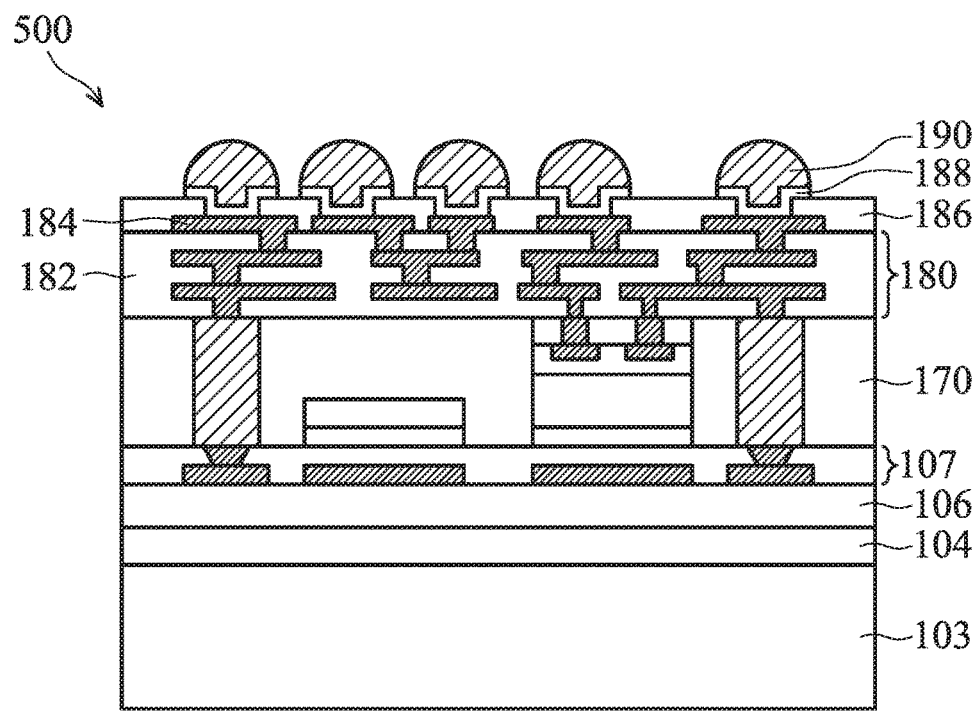

Afterwards, the passivation layer 186 is formed on the redistribution lines (RDL) 184, as shown in FIG. 5E, in accordance with some embodiments of the disclosure. The UBM layer 188 is formed in the passivation layer 186, and the electrical connector 190 is formed on the UBM layer 188. Therefore, the package structure 500 is obtained.

Figure 5F:
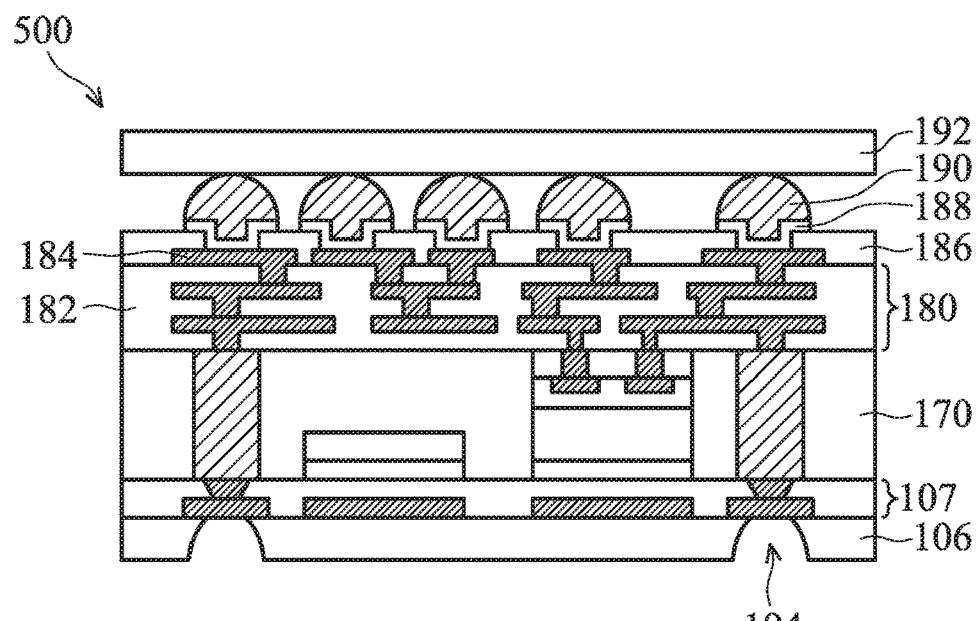

After the electrical connector 190 is formed, the carrier substrate 103 and the release layer 104 are removed, as shown in FIG. 5F, in accordance with some embodiments of the disclosure. Afterwards, the electrical connector 190 is attached to a carrier 192. Afterwards, a portion of the dielectric layer 106 is removed to form openings 194. The metal layer of the backside redistribution structure 107 is exposed by the opening 194.

Figure 5G:
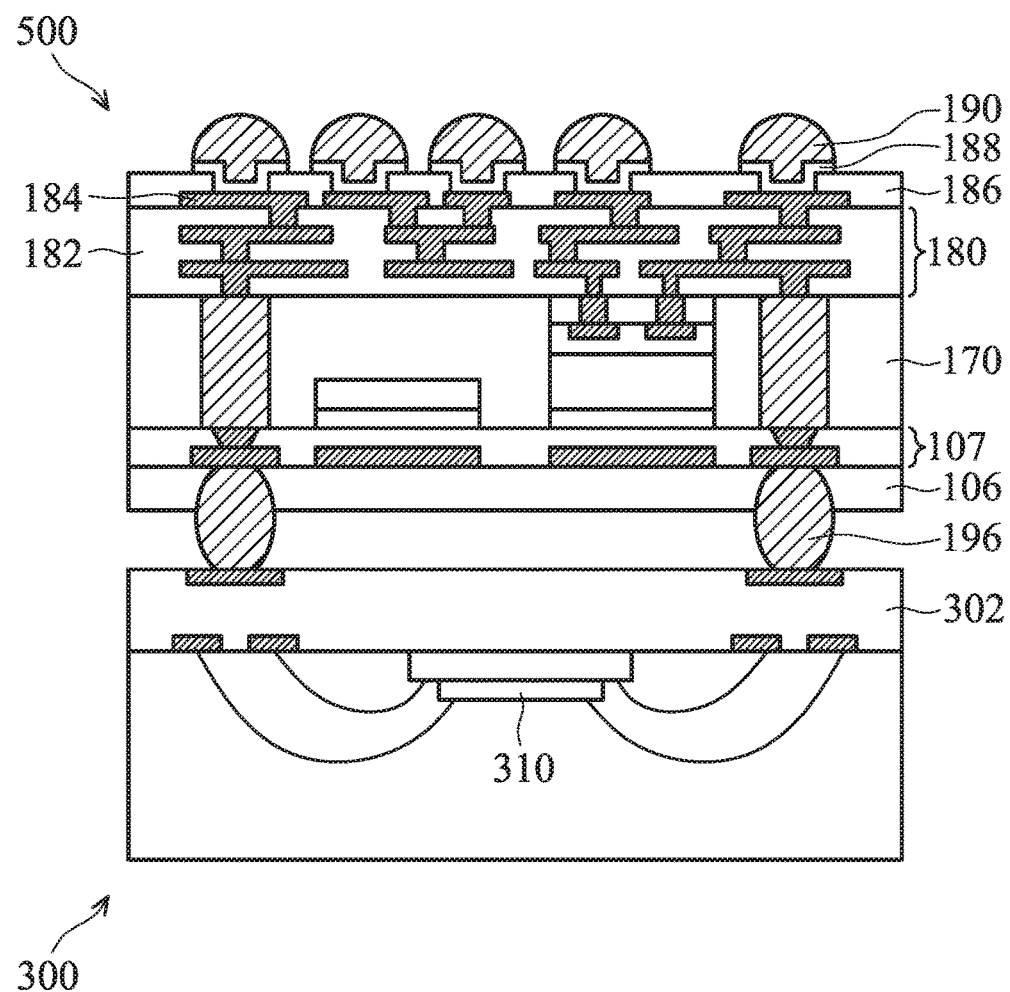

After the opening 194 is formed, an electrical connector 196 is filled into the opening 194, as shown in FIG. 5G, in accordance with some embodiments of the disclosure. Afterwards, the top package 300 is bonded to the package structure 500 by the electrical connector 196. The top package 300 includes a package substrate 302 and device dies 310.

Figure 6A:
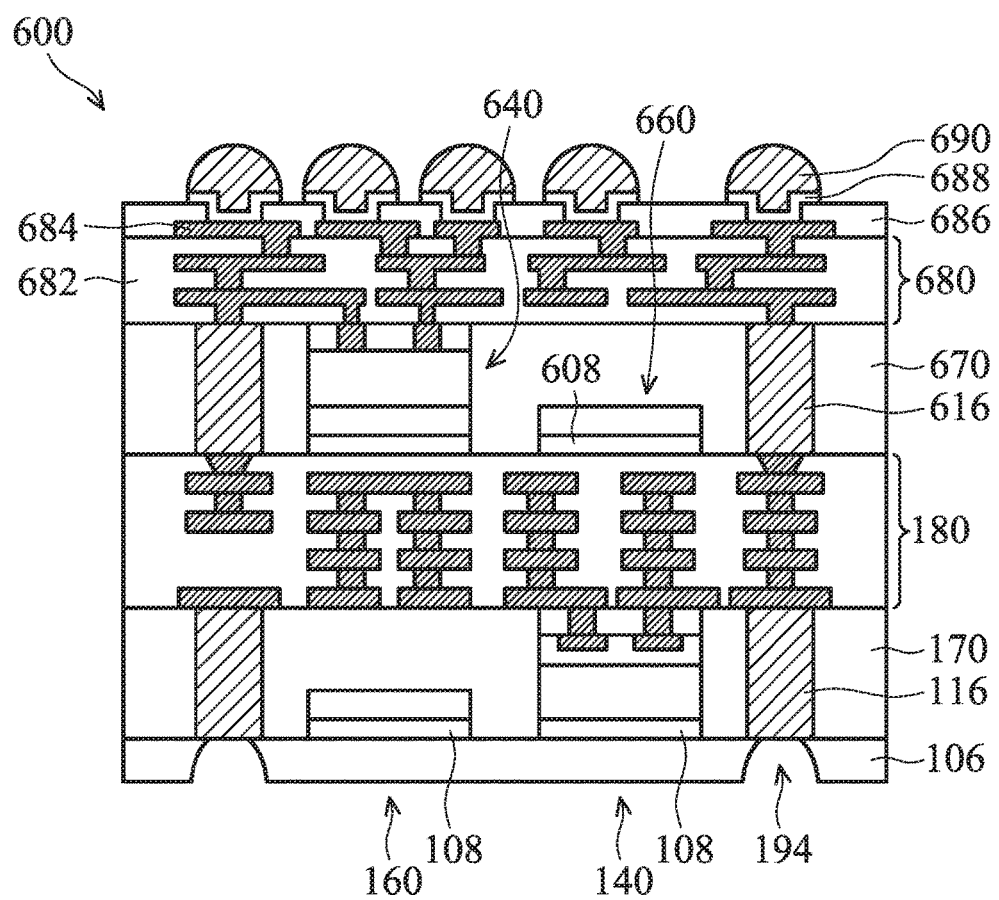
FIGS. 6A-6B show cross-sectional representations of various stages of forming a package structure, in accordance with some embodiments of the disclosure.
Figure 6B:
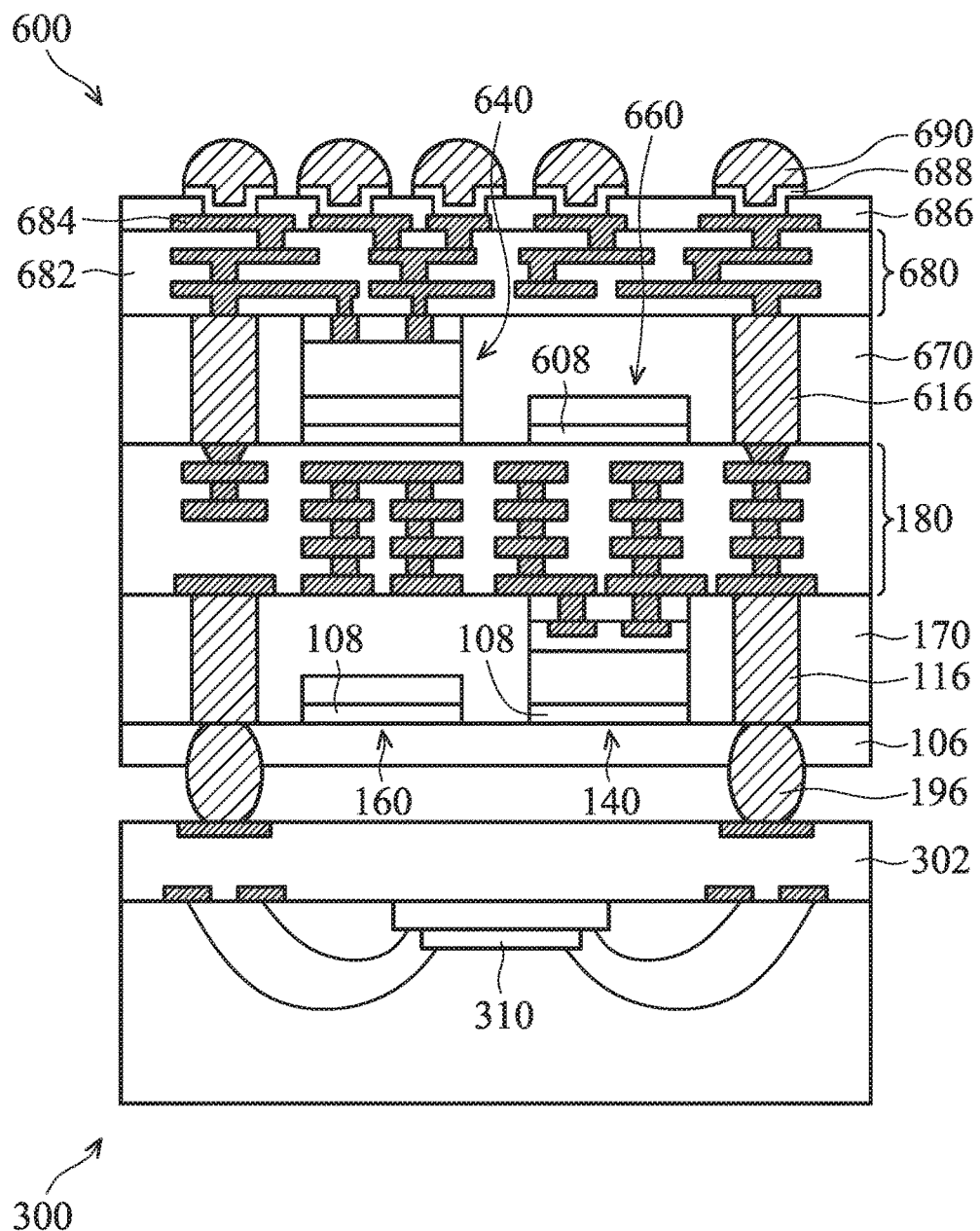

FIGS. 6A-6B show cross-sectional representations of various stages of forming a package structure 600, in accordance with some embodiments of the disclosure. Some processes and materials used to form the package structure 600 are similar to, or the same as, those used to form package structure 200 and are not repeated herein.

As shown in FIG. 6A, the first device die 140 and the first dummy die 160 are formed on the dielectric layer 106. The through vias 116 are formed on the dielectric layer 106. The first device die 140, the first dummy die 160 and the through vias 116 are encapsulated by the package layer 170.

The redistribution structure 180 is formed on the package layer 170. A second dummy die 660 and a second device die 640 are formed on the redistribution structure 180. The second through vias 616 are formed on the redistribution structure 180. The second dummy die 660, the second device die 640, and the second through vias 616 are encapsulated by the second package layer 670. The second dummy die 660 is directly above the first device die 140, and the second device die 640 is directly above the first dummy die 160 to prevent the asymmetric warpage of the package structure 600.

The second redistribution structure 680 is formed on the second package layer 670. The second redistribution structure 680 includes redistribution lines (RDL) 684 formed in the passivation layer 682. The passivation layer 686 is formed on the redistribution lines (RDL) 684. The UBM layer 688 is formed in the passivation layer 686, and the electrical connector 690 is formed on the UBM layer 688.

Afterwards, the electrical connector 690 is attached to a carrier (not shown). Afterwards, a portion of the dielectric layer 106 is removed to form openings 194. The bottom surface of the through vias 116 is exposed by the opening 194.

After the opening 194 is formed, an electrical connector 196 is filled into the opening 194, as shown in FIG. 6B, in accordance with some embodiments of the disclosure. Afterwards, the top package 300 is bonded to the package structure 600 by the electrical connector 196. The top package 300 includes a package substrate 302 and device dies 310.

Embodiments for forming a package structure and method for forming the same are provided. A dummy die and a device die are formed on a substrate, and the dummy die and the device die are encapsulated by a package layer. A redistribution structure is formed on the package layer. The device die has a first height, and the dummy die has a second height. The second height is smaller than the first height. As a result, the interface between the dummy die and the package layer is away from the redistribution structure. Therefore, the problem of the redistribution structure cracking is reduced, and the performance of the package structure is improved.

In some embodiments, a package structure is provided. The package structure includes a package component, and a device die formed over the package component. The device die includes a device substrate and a conductive pad over the device substrate, and the device die has a first height. The package structure also includes a dummy die formed over the package component and adjacent to the device die, and the dummy die has a second height smaller than the first height.

In some embodiments, a package structure is provided. The package structure includes a redistribution structure having a first side and a second side and a first device die arranged on the first side of the redistribution structure and electrically connected to the redistribution structure. The first device die defines a first thickness. The package structure includes a first dummy die arranged on the first side of the redistribution structure and adjacent to the first device die, and the first dummy die defines a second thickness smaller than the first thickness. The package structure further includes a first package layer surrounding the first device die and the first dummy die.

In some embodiments, a package structure is provided. The package structure includes a first package structure. The first package structure includes a first redistribution structure having a first side and a second side and a first device die arranged over the first side of the redistribution structure. The first package structure includes a first dummy die arranged over the first side of the first redistribution structure and a first package layer surrounding the first device die and the first dummy die. A surface of the first dummy die facing away the first redistribution structure is covered by the first package layer. The package structure also includes a second package structure. The second package structure includes a second redistribution structure formed over the first package layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a package component;
a device die formed over the package component, wherein the device die comprises a device substrate and a conductive pad over the device substrate, and the device die has a first height; and
a dummy die formed over the package component and adjacent to the device die, wherein the dummy die has a second height smaller than the first height.

2. The package structure as claimed in claim 1, further comprising:
a buffer layer formed below the dummy die, wherein a bottom surface of the buffer layer is higher than a bottom surface of the device die.

3. The package structure as claimed in claim 1, further comprising:
a through via formed adjacent to the device die, wherein the through via has a third height, the third height is higher than the first height; and
a package layer formed between the through via and the device die.

4. The package structure as claimed in claim 3, wherein the package component comprises a redistribution structure formed below the package layer, wherein the redistribution structure is electrically connected to the device die.

5. The package structure as claimed in claim 1, wherein a height ratio of the second height to the first height is in a range from about 65% to about 85%.

6. The package structure as claimed in claim 1, wherein a coefficient of thermal expansion (CTE) of the dummy die is substantially identical to a coefficient of thermal expansion (CTE) of the device die.

7. The package structure as claimed in claim 1, further comprising:
a through via formed adjacent to the device die; and a second package structure formed below the device die, wherein the second package structure is electrically connected to the through via.

8. A package structure, comprising:
a redistribution structure having a first side and a second side;
a first device die arranged on the first side of the redistribution structure and electrically connected to the redistribution structure, wherein the first device die defines a first thickness;
a first dummy die arranged on the first side of the redistribution structure and adjacent to the first device die, wherein the first dummy die defines a second thickness smaller than the first thickness; and
a first package layer surrounding the first device die and the first dummy die.

9. The package structure as claimed in claim 8, further comprising:
a through via formed adjacent to the first device die, wherein a top surface of the through via is leveled with a top surface of the first device die.

10. The package structure as claimed in claim 9, further comprising:
a second package structure formed below the device die, wherein the second package structure is electrically connected to the through via.

11. The package structure as claimed in claim 8, wherein a top surface of the first device die and a top surface of the first dummy die are substantially coplanar.

12. The package structure as claimed in claim 8, wherein the first dummy die is separated from the redistribution structure by the first package layer.

13. The package structure as claimed in claim 8, wherein a coefficient of thermal expansion (CTE) of the first dummy die is the same as a coefficient of thermal expansion (CTE) of the first device die.

14. The package structure as claimed in claim 8, further comprising:
a second device die formed below the first package layer; and
a second dummy die formed adjacent to the second device die.

15. The package structure as claimed in claim 14, further comprising:
a second package layer formed between the second device die and the second dummy die, wherein a bottom surface of the second dummy die is covered by the second package layer.

16. A package structure, comprising:
a first package structure, comprising:
a first redistribution structure having a first side and a second side;
a first device die arranged over the first side of the redistribution structure;
a first dummy die arranged over the first side of the first redistribution structure; and
a first package layer surrounding the first device die and the first dummy die, wherein a surface of the first dummy die facing away the first redistribution structure is covered by the first package layer; and
a second package structure, comprising:
a second redistribution structure formed over the first package layer.

17. The package structure as claimed in claim 16, further comprising:
a through via formed adjacent to the first device die, wherein the through via is electrically connected to the first redistribution structure, and the second redistribution structure is electrically connected to the first device die.

18. The package structure as claimed in claim 16, further comprising:
a second dummy die formed over the second redistribution structure, wherein the first device die has a first height, the first dummy die has a second height, and the second height is smaller than the first height.

19. The package structure as claimed in claim 16, further comprising:
a buffer layer formed below a bottom surface of the first dummy die, wherein the buffer layer is formed between the first dummy die and the first package layer.

20. The package structure as claimed in claim 16, further comprising:
a third package structure formed above the second package structure, wherein the second package structure is formed between the first package structure and the third package structure.

* * * * *